(12) United States Patent
Gong (10) Patent No.: US 10,269,320 B1
(45) Date of Patent: Apr. 23, 2019

(54) GOA CIRCUIT AND EMBEDDED TOUCH DISPLAY PANEL

(71) Applicant: Wuhan China Star Optoelectronics Technology Co., LTD., Wuhan (CN)

(72) Inventor: Qiang Gong, Hubei (CN)

(73) Assignee: WUHAN CHINA STAR OPTOELECTRONICS SEMICONDUCTOR DISPLAY TECHNOLOGYCO., LTD., Wuhan (CN)

(*) Notice: Subject to any disclaimer, the term of this patent is extended or adjusted under 35 U.S.C. 154(b) by 0 days.

(21) Appl. No.: 15/742,471

(22) PCT Filed: Dec. 28, 2017

(86) PCT No.: PCT/CN2017/119420
§ 371 (c)(1),
(2) Date: Jan. 5, 2018

(30) Foreign Application Priority Data

Nov. 27, 2017 (CN) .......................... 2017 1 1204774

(51) Int. Cl.
*G09G 3/36* (2006.01)
*G06F 3/041* (2006.01)

(52) U.S. Cl.
CPC ......... *G09G 3/3677* (2013.01); *G06F 3/0412* (2013.01); *G06F 3/0416* (2013.01); *G09G 2300/0426* (2013.01); *G09G 2310/0283* (2013.01)

(58) Field of Classification Search
CPC ................. G06F 3/0484; G06F 17/211; G06F 17/30011; G06F 3/0482; G06F 17/2705; G06K 9/00442; G06Q 10/10; G06Q 10/103
See application file for complete search history.

(56) References Cited

U.S. PATENT DOCUMENTS

| 2004/0141137 A1* | 7/2004 | Hirabayashi ...... G02F 1/134309 349/149 |
| 2012/0001878 A1* | 1/2012 | Kurokawa ............ G06F 3/0412 345/204 |
| 2016/0266699 A1* | 9/2016 | Zhao ..................... G09G 3/3677 |
| 2016/0351156 A1* | 12/2016 | Wu ......................... G11C 19/28 |

* cited by examiner

*Primary Examiner* — Shaheda A Abdin
(74) *Attorney, Agent, or Firm* — Kirton McConkie; Evan R. Witt (57) ABSTRACT

In a GOA circuit and an embedded touch display panel of the present disclosure, by providing a suppression module in each of multiple levels of GOA units, when the embedded touch display panel enters a stage in which signal interruption occurs and touch scanning is performed, a second node control signal on a second node is pulled down to a constant-voltage low level. This relieves the insufficiency in retaining capability of the GOA circuit in the case of TP interruption and further decreases the risk of stage-shift failure so that this GOA circuit becomes more stable.

20 Claims, 4 Drawing Sheets

GOA CIRCUIT AND EMBEDDED TOUCH DISPLAY PANEL

FIELD OF INVENTION

The present disclosure relates to the technical field of display technology, and more particularly to a GOA circuit and an embedded touch display panel.

BACKGROUND OF INVENTION

The GOA (i.e. gate driver on array) technique is a driving method that achieves progressive scanning by manufacturing a gate scanning driving circuit on a thin-film transistor array substrate by a thin-film transistor liquid crystal display array manufacturing process.

At present, with the maturity of the integrated touch panel technique, embedded touch display panels are often used as display panels. In an embedded touch display panel, since time for displaying and time for refreshing are separated to spare time (TP interruption time) for touch scanning, an operating state of the GOA circuit of such panel is not continuous any more. Instead, scanning will be retained for a certain period of time whenever a certain number of levels are scanned, and then the scanning may proceed to next certain number of levels. In this case, when the GOA circuit is in the retained state, the problem of insufficiency in the retaining capability easily occurs. As a result, stage-shift failure occurs in the GOA circuit, which leads to abnormal display.

SUMMARY OF INVENTION

An objective of an embodiment of the present disclosure is to provide a GOA circuit and an embedded touch display panel, by which the insufficiency in retaining capability of the GOA circuit in the case of TP interruption can be relieved and the risk of stage-shift failure can be further decreased so that this GOA circuit becomes more stable.

A GOA (Gate driver On Array) circuit is configured to be applied in an embedded touch display panel and comprises multiple levels of GOA units which are cascaded with each other, the nth-level GOA unit comprising a forward/reverse scanning control module, a node control module, an output module, an output control module, and a suppression module; wherein the forward/reverse scanning control module is configured to output a first node control signal at a first node and output a second node control signal at a second node according to a forward scanning DC control signal and a reverse scanning DC control signal;

the node control module is coupled to the first node and the second node and configured to pull the first node control signal down to a constant-voltage low level and pull the second node control signal up to a constant-voltage high level;

the output module is coupled to the first node and electrically connected to a first clock signal and configured to output a scanning signal according to the first node control signal and the first clock signal;

the output control module is electrically connected to the first control signal and configured to pull the scanning signal down to the constant-voltage low level according to the first control signal; and the suppression module is coupled to the second node and configured to pull the second node control signal on the second node down to the constant-voltage low level when the embedded touch display panel enters a stage in which signal interruption occurs and touch scanning is performed;

wherein the suppression module comprises a second thin-film transistor;

the constant-voltage low level is applied to a source of the second thin-film transistor, the first control signal is applied to a gate of the second thin-film transistor, and a drain of the second thin-film transistor is connected to the second node;

wherein the first control signal is in low level when the embedded touch display panel displays normally; and the first control signal is in high level when the embedded touch display panel enters a stage in which signal interruption occurs and touch scanning is performed.

In the GOA circuit of the present disclosure, the forward/reverse scanning control module comprises a third thin-film transistor, a fourth thin-film transistor, a fifth thin-film transistor, a first capacitor and a second capacitor;

the forward scanning DC control signal is applied to a source of the third thin-film transistor, a scanning signal of a (n−2)th-level GOA unit is applied to a gate of the third thin-film transistor, and a drain of the third thin-film transistor is connected to the first node, the drain of the second thin-film transistor, and the gate of the third thin-film transistor;

the reverse scanning DC control signal is applied to a source of the fourth thin-film transistor, and a scanning signal of a (n+2)th-level GOA unit is applied to a gate of the fourth thin-film transistor;

the constant-voltage low level is applied to a source of the fifth thin-film transistor, and a drain of the fifth thin-film transistor is connected to the second node;

one end of the first capacitor is connected to the first node, and the constant-voltage low level is applied to the other end of the first capacitor; and one end of the second capacitor is connected to the second node, and the constant-voltage low level is applied to the other end of the second capacitor.

In the GOA circuit of the present disclosure, the node control module comprises a sixth thin-film transistor, a seventh thin-film transistor, an eighth thin-film transistor and a ninth thin-film transistor;

a second clock signal is applied to a source of the sixth thin-film transistor, the forward scanning DC control signal is applied to a gate of the sixth thin-film transistor, and a drain of the sixth thin-film transistor is connected to a gate of the eighth thin-film transistor;

a third clock signal is applied to a source of the seventh thin-film transistor, the reverse scanning DC control signal is applied to a gate of the seventh thin-film transistor, and a drain of the seventh thin-film transistor is connected to the gate of the eighth thin-film transistor;

the constant-voltage high level is applied to a source of the eighth thin-film transistor, and a drain of the eighth thin-film transistor is connected to the second node; and the constant-voltage low level is applied to a source of the ninth thin-film transistor, a gate of the ninth thin-film transistor is connected to the second node, and a drain of the ninth thin-film transistor is connected to the first node.

In the GOA circuit of the present disclosure, the output module comprises a tenth thin-film transistor; and the first clock signal is applied to a source of the tenth thin-film transistor, a gate of the tenth thin-film transistor is connected to the first node, and a drain of the tenth thin-film transistor is connected to an output end of the output module.

In the GOA circuit of the present disclosure, the output module comprises an eleventh thin-film transistor and a twelfth thin-film transistor;

the constant-voltage low level is applied to a source of the eleventh thin-film transistor, a gate of the eleventh thin-film transistor is connected to the second node, and a drain of the eleventh thin-film transistor is connected to an output end of the output module; and the constant-voltage low level is applied to a source of the twelfth thin-film transistor, a gate of the twelfth thin-film transistor is connected to the first control signal, and a drain of the twelfth thin-film transistor is connected to the output end of the output module.

In the GOA circuit of the present disclosure, the nth-level GOA unit further comprises a reset module; and the reset module comprises a thirteenth thin-film transistor, wherein a reset signal is applied to a source and to a drain of the thirteenth thin-film transistor, and a drain of the thirteenth thin-film transistor is electrically connected to the second node.

In the GOA circuit of the present disclosure, when the GOA circuit scans forward, the forward scanning DC control signal is in high level and the reverse scanning DC control signal is in low level; and when the GOA circuit scans reversely, the forward scanning DC control signal is in low level and the reverse scanning DC control signal is in high level.

A GOA (Gate driver On Array) circuit is configured to be applied in an embedded touch display panel, and comprises multiple levels of GOA units which are cascaded with each other, the nth-level GOA unit comprising a forward/reverse scanning control module, a node control module, an output module, an output control module, and a suppression module; wherein the forward/reverse scanning control module is configured to output a first node control signal at a first node and output a second node control signal at a second node according to a forward scanning DC control signal and a reverse scanning DC control signal;

the node control module is coupled to the first node and the second node and configured to pull the first node control signal down to a constant-voltage low level and pull the second node control signal up to a constant-voltage high level;

the output module is coupled to the first node and electrically connected to a first clock signal and configured to output a scanning signal according to the first node control signal and the first clock signal;

the output control module is electrically connected to the first control signal and configured to pull the scanning signal down to the constant-voltage low level according to the first control signal; and the suppression module is coupled to the second node and configured to pull the second node control signal on the second node down to the constant-voltage low level when the embedded touch display panel enters a stage in which signal interruption occurs and touch scanning is performed.

In the GOA circuit of the present disclosure, the suppression module comprises a second thin-film transistor; and the constant-voltage low level is applied to a source of the second thin-film transistor, the first control signal is applied to a gate of the second thin-film transistor, and a drain of the second thin-film transistor is connected to the second node.

In the GOA circuit of the present disclosure, the forward/reverse scanning control module comprises a third thin-film transistor, a fourth thin-film transistor, a fifth thin-film transistor, a first capacitor and a second capacitor;

the forward scanning DC control signal is applied to a source of the third thin-film transistor, a scanning signal of a (n−2)th-level GOA unit is applied to a gate of the third thin-film transistor, and a drain of the third thin-film transistor is connected to the first node, the drain of the second thin-film transistor, and the gate of the third thin-film transistor;

the reverse scanning DC control signal is applied to a source of the fourth thin-film transistor, and a scanning signal of a (n+2)th-level GOA unit is applied to a gate of the fourth thin-film transistor;

the constant-voltage low level is applied to a source of the fifth thin-film transistor, and a drain of the fifth thin-film transistor is connected to the second node;

one end of the first capacitor is connected to the first node, and the constant-voltage low level is applied to the other end of the first capacitor; and one end of the second capacitor is connected to the second node, and the constant-voltage low level is applied to the other end of the second capacitor.

In the GOA circuit of the present disclosure, the node control module comprises a sixth thin-film transistor, a seventh thin-film transistor, an eighth thin-film transistor and a ninth thin-film transistor;

a second clock signal is applied to a source of the sixth thin-film transistor, the forward scanning DC control signal is applied to a gate of the sixth thin-film transistor, and a drain of the sixth thin-film transistor is connected to a gate of the eighth thin-film transistor;

a third clock signal is applied to a source of the seventh thin-film transistor, the reverse scanning DC control signal is applied to a gate of the seventh thin-film transistor, and a drain of the seventh thin-film transistor is connected to the gate of the eighth thin-film transistor;

the constant-voltage high level is applied to a source of the eighth thin-film transistor, and a drain of the eighth thin-film transistor is connected to the second node; and the constant-voltage low level is applied to a source of the ninth thin-film transistor, a gate of the ninth thin-film transistor is connected to the second node, and a drain of the ninth thin-film transistor is connected to the first node.

In the GOA circuit of the present disclosure, the output module comprises a tenth thin-film transistor; and the first clock signal is applied to a source of the tenth thin-film transistor, a gate of the tenth thin-film transistor is connected to the first node, and a drain of the tenth thin-film transistor is connected to an output end of the output module.

In the GOA circuit of the present disclosure, the output module comprises an eleventh thin-film transistor and a twelfth thin-film transistor;

the constant-voltage low level is applied to a source of the eleventh thin-film transistor, a gate of the eleventh thin-film transistor is connected to the second node, and a drain of the eleventh thin-film transistor is connected to an output end of the output module; and the constant-voltage low level is applied to a source of the twelfth thin-film transistor, a gate of the twelfth thin-film transistor is connected to the first control signal, and a drain of the twelfth thin-film transistor is connected to the output end of the output module.

In the GOA circuit of the present disclosure, the nth-level GOA unit further comprises a reset module; and the reset module comprises a thirteenth thin-film transistor, wherein a reset signal is applied to a source and to a drain of the thirteenth thin-film transistor, and a drain of the thirteenth thin-film transistor is electrically connected to the second node.

In the GOA circuit of the present disclosure, the first control signal is in low level when the embedded touch display panel displays normally; and the first control signal is in high level when the embedded touch display panel enters a stage in which signal interruption occurs and touch scanning is performed.

In the GOA circuit of the present disclosure, when the GOA circuit scans forward, the forward scanning DC control signal is in high level and the reverse scanning DC control signal is in low level; and when the GOA circuit scans reversely, the forward scanning DC control signal is in low level and the reverse scanning DC control signal is in high level.

An embedded touch display panel comprises a GOA circuit, wherein the GOA circuit is configured to be applied in an embedded touch display panel and comprises multiple levels of GOA units which are cascaded with each other, the nth-level GOA unit comprising a forward/reverse scanning control module, a node control module, an output module, an output control module, and a suppression module; wherein the forward/reverse scanning control module is configured to output a first node control signal at a first node and output a second node control signal at a second node according to a forward scanning DC control signal and a reverse scanning DC control signal;

the node control module is coupled to the first node and the second node and configured to pull the first node control signal down to a constant-voltage low level and pull the second node control signal up to a constant-voltage high level;

the output module is coupled to the first node and electrically connected to a first clock signal and configured to output a scanning signal according to the first node control signal and the first clock signal;

the output control module is electrically connected to the first control signal and configured to pull the scanning signal down to the constant-voltage low level according to the first control signal; and the suppression module is coupled to the second node and configured to pull the second node control signal on the second node down to the constant-voltage low level when the embedded touch display panel enters a stage in which signal interruption occurs and touch scanning is performed.

In the embedded touch display panel of the present disclosure, the suppression module comprises a second thin-film transistor; and the constant-voltage low level is applied to a source of the second thin-film transistor, the first control signal is applied to a gate of the second thin-film transistor, and a drain of the second thin-film transistor is connected to the second node.

In the embedded touch display panel of the present disclosure, the first control signal is in low level when the embedded touch display panel displays normally; and the first control signal is in high level when the embedded touch display panel enters a stage in which signal interruption occurs and touch scanning is performed.

In the embedded touch display panel of the present disclosure, when the GOA circuit scans forward, the forward scanning DC control signal is in high level and the reverse scanning DC control signal is in low level; and when the GOA circuit scans reversely, the forward scanning DC control signal is in low level and the reverse scanning DC control signal is in high level.

In a GOA circuit and an embedded touch display panel of the present disclosure, by providing a suppression module in each of multiple levels of GOA units, when the embedded touch display panel enters a stage in which signal interruption occurs and touch scanning is performed, a second node control signal on a second node is pulled down to a constant-voltage low level. This relieves the insufficiency in retaining capability of the GOA circuit in the case of TP interruption and further decreases the risk of stage-shift failure so that this GOA circuit becomes more stable.

DESCRIPTION OF DRAWINGS

In order to explain the technical solutions in the present embodiments or in the prior art more clearly, accompanying drawings required in the description of the present embodiments or prior art will be briefly described. Obviously, accompanying drawings are just some embodiments of the present disclosure, while other drawings may be obtained by those skilled in the art according to these drawings, without making any creative effort.

DETAILED DESCRIPTION OF THE PREFERRED EMBODIMENTS

Following description of each embodiment is referring to the accompanying drawings so as to make the contents of the present disclosure more apparent and understandable. The described embodiments are some but not all of the embodiments of the present disclosure. All other embodiments obtained by a person of ordinary skill in the art based on the embodiments of the present disclosure without creative efforts shall fall within the protection scope of the present disclosure.

Figure 1:
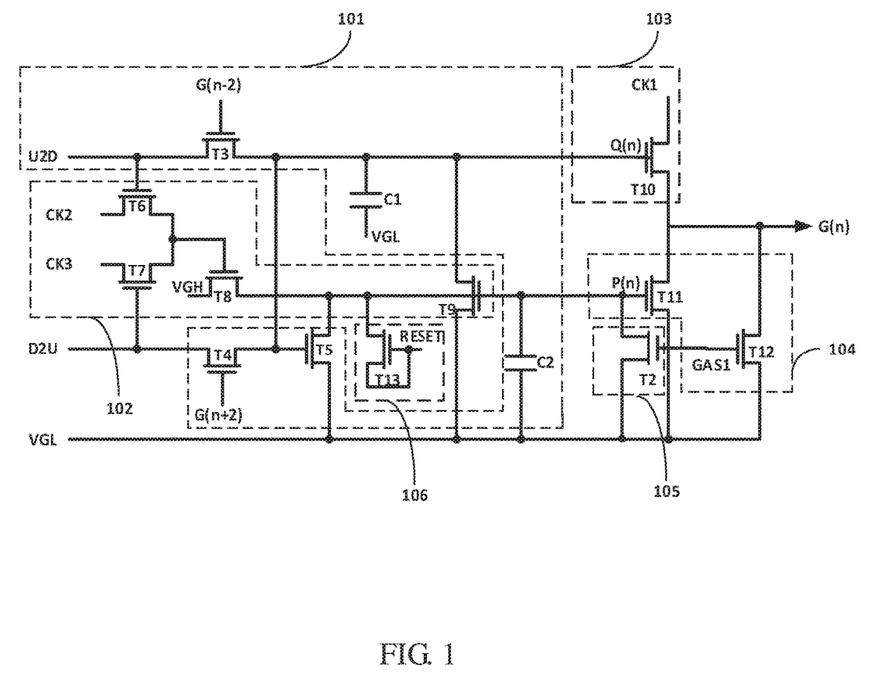
FIG. 1 is a circuit diagram of a GOA circuit according to a preferred embodiment of the present disclosure.

Please refer to FIG. 1, which is a circuit diagram of a GOA circuit according to a preferred embodiment of the present disclosure. As shown in FIG. 1, an embodiment of the present disclosure provides a GOA circuit, comprising multiple levels of GOA units which are cascaded with each other, the nth-level GOA unit comprising a forward/reverse scanning control module 101, a node control module 102, an output module 103, an output control module 104, and a suppression module 105. It is to be noted that the nth-level GOA unit mentioned here is a GOA unit rather than a first-level GOA unit, a second-level GOA unit, a second-last-level GOA unit and a last-level GOA unit.

The forward/reverse scanning control module 101 is configured to output a first node control signal at a first node Q(n) and output a second node control signal at a second node P(n) according to a forward scanning DC control signal U2D and a reverse scanning DC control signal D2U.

Specifically, the forward/reverse scanning control module 101 comprises a third thin-film transistor T3, a fourth thin-film transistor T4, a fifth thin-film transistor T5, a first capacitor C1 and a second capacitor C2. The forward scanning DC control signal U2D is applied to a source of the third thin-film transistor T3, a scanning signal G(n−2) of a (n−2)th-level GOA unit is applied to a gate of the third thin-film transistor T3, and a drain of the third thin-film transistor T3 is connected to the first node Q(n), a drain of the fourth thin-film transistor T4 and a gate of the fifth thin-film transistor T5; the reverse scanning DC control signal D2U is applied to a source of the fourth thin-film transistor T4, and a scanning signal G(n+2) of a (n+2)th-level GOA unit is applied to a gate of the fourth thin-film transistor T4; a constant-voltage low level VGL is applied to a source of the fifth thin-film transistor T5, and a drain of the fifth thin-film transistor T5 is connected to the second node P(n); one end of the first capacitor C1 is connected to the first node Q(n) and the constant-voltage low level VGL is applied to the other end of the first capacitor C1; and one end of the second capacitor C2 is connected to the second node P(n) and the constant-voltage low level VGL is applied to the other end of the second capacitor C2.

The node control module 102 is coupled to the first node Q(n) and the second node P(n) and configured to pull the first node control signal down to the constant-voltage low level VGL and pull the second node control signal up to a constant-voltage high level VGH.

Specifically, the node control module 102 comprises a sixth thin-film transistor T6, a seventh thin-film transistor T7, an eighth thin-film transistor T8 and a ninth thin-film transistor T9. A second clock signal CK2 is applied to a source of the sixth thin-film transistor T6, the forward scanning DC control signal U2D is applied to a gate of the sixth thin-film transistor T6, and a drain of the sixth thin-film transistor T6 is connected to a gate of the eighth thin-film transistor T8; a third clock signal CK3 is applied to a source of the seventh thin-film transistor T7, the reverse scanning DC control signal D2U is applied to a gate of the seventh thin-film transistor T7, and a drain of the seventh thin-film transistor T7 is connected to the gate of the eighth thin-film transistor T8; the constant-voltage high level VGH is applied to a source of the eighth thin-film transistor T8, and a drain of the eighth thin-film transistor T8 is connected to the second node P(n); and a constant-voltage low level VGL is applied to a source of the ninth thin-film transistor T9, a gate of the ninth thin-film transistor T9 is connected to the second node, and a drain of the ninth thin-film transistor T9 is connected to the first node Q(n).

The output module 103 is coupled to the first node Q(n) and electrically connected to a first clock signal CK1 and configured to output a scanning signal G(n) according to the first node control signal and the first clock signal CK1.

Specifically, the output module 103 comprises a tenth thin-film transistor T10; and the first clock signal CK1 is applied to a source of the tenth thin-film transistor T10, a gate of the tenth thin-film transistor T10 is connected to the first node Q(n), and a drain of the tenth thin-film transistor T10 is connected to an output end of the output module 103.

The output control module 104 is electrically connected to the first control signal GAS1 and configured to pull the scanning signal G(n) down to a constant-voltage low level VGL according to the first control signal GAS1.

Specifically, the output module 104 comprises an eleventh thin-film transistor T11 and a twelfth thin-film transistor T12; a constant-voltage low level VGL is applied to a source of the eleventh thin-film transistor T11, a gate of the eleventh thin-film transistor T11 is connected to the second node P(n), and a drain of the eleventh thin-film transistor T11 is connected to an output end of the output module 103; and the constant-voltage low level VGL is applied to a source of the twelfth thin-film transistor T12, a gate of the twelfth thin-film transistor T12 is connected to the first control signal GAS1, and a drain of the twelfth thin-film transistor T12 is connected to the output end of the output module 103.

The suppression module 105 is coupled to the second node P(n) and configured to pull a second node control signal on the second node P(n) down to the constant-voltage low level VGL when the embedded touch display panel enters a stage in which signal interruption occurs and touch scanning is performed.

Specifically, the suppression module 105 comprises a second thin-film transistor T2.

The constant-voltage low level VGL is applied to a source of the second thin-film transistor T2, the first control signal GAS1 is applied to a gate of the second thin-film transistor T2, and a drain of the second thin-film transistor T2 is connected to the second node P(n).

Further, the nth-level GOA unit further comprises a reset module 106; and the reset module 106 comprises a thirteenth thin-film transistor T13, a reset signal RESET is applied to a source and to a drain of the thirteenth thin-film transistor T13, and the drain of the thirteenth thin-film transistor T13 is electrically connected to the second node P(n). It is to be noted that the reset module 106 can be used to reset the GOA circuit during the operation of the GOA circuit, so that the GOA circuit becomes more stable.

Figure 2:
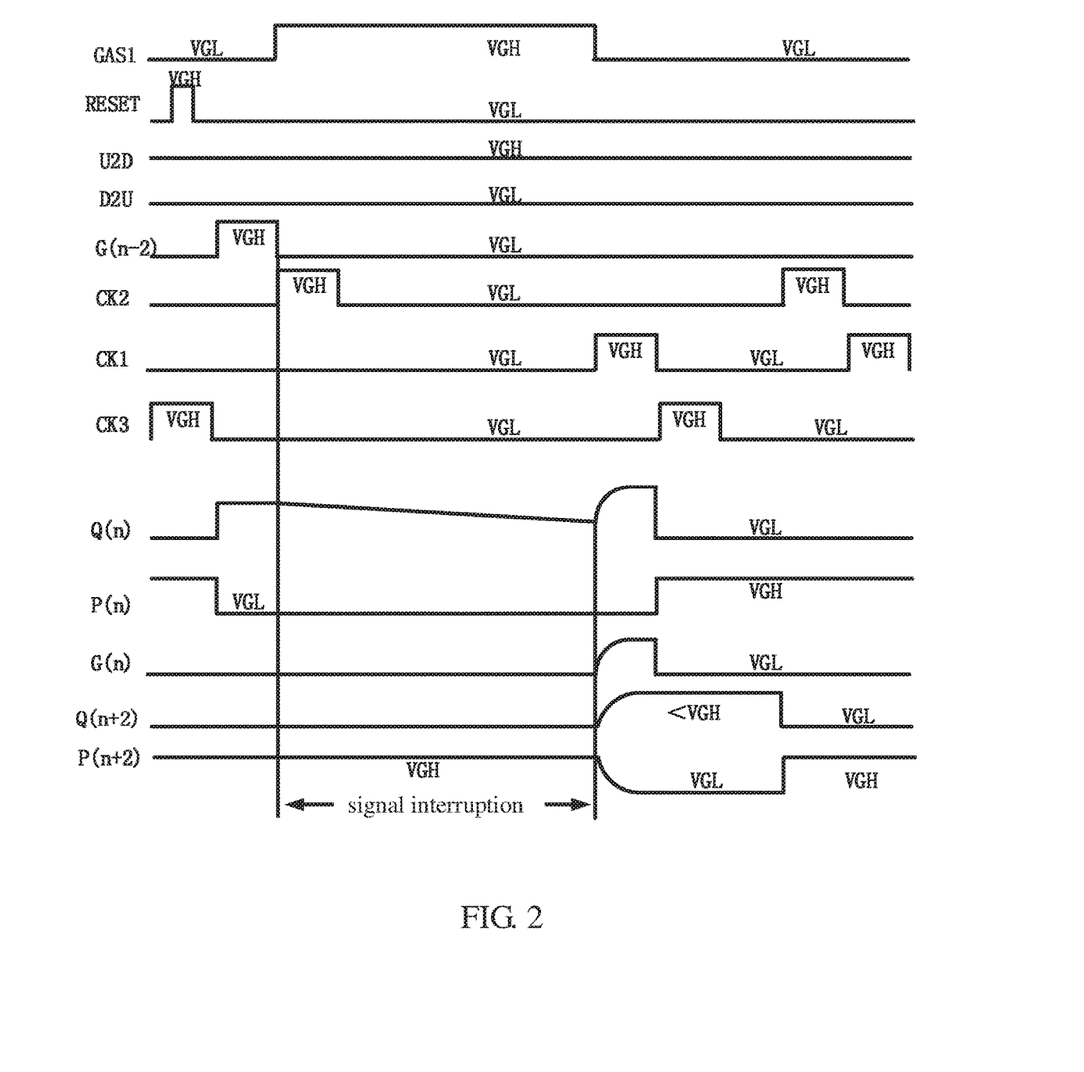
FIG. 2 is a first timing diagram of the GOA circuit according to a preferred embodiment of the present disclosure.
Figure 3:
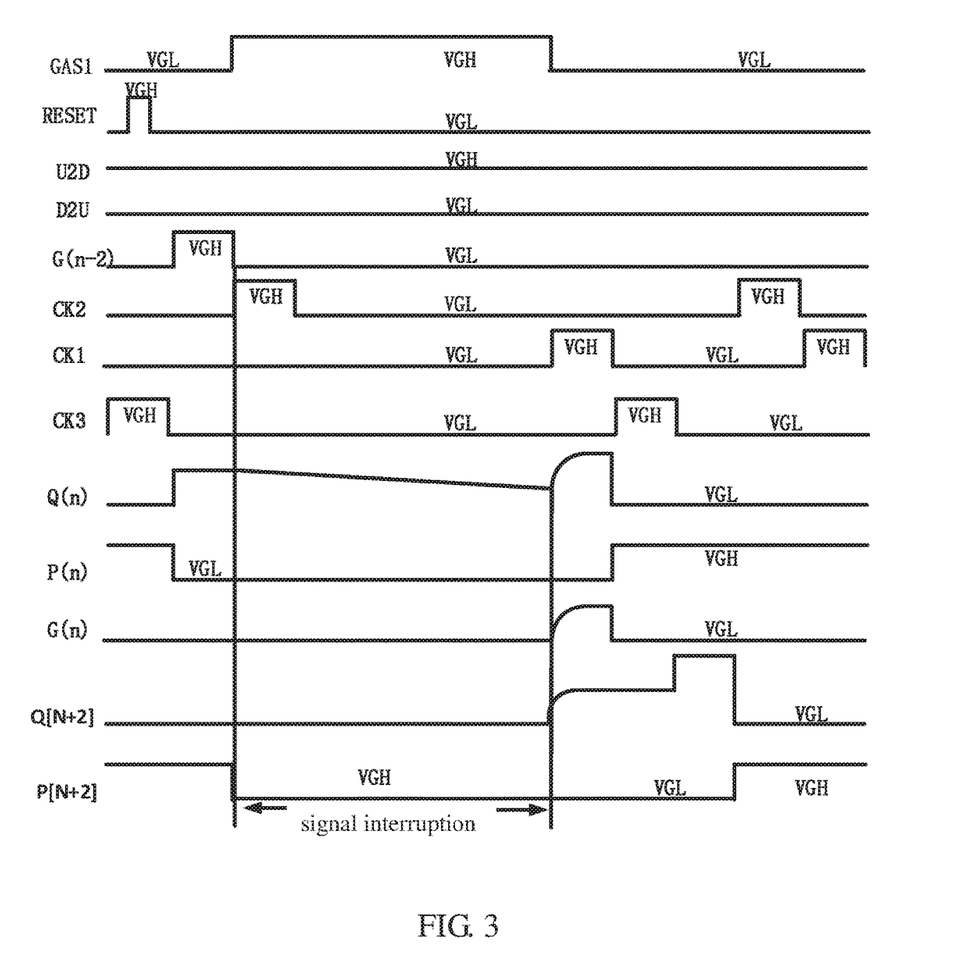
FIG. 3 is a second timing diagram of the GOA circuit according to a preferred embodiment of the present disclosure.

The specific operating process of the GOA circuit according to the embodiment of the present disclosure will be described with reference to FIG. 2 and FIG. 3, by exemplifying the forward scanning performed by the GOA according to the embodiment of the present disclosure, wherein FIG. 2 is a first timing diagram of the GOA circuit according to the present disclosure; FIG. 3 is a second timing diagram of the GOA circuit according to the present disclosure.

As shown in FIG. 2 and FIG. 3, it is to be noted that the first control signal GAS1 is in low level when the embedded touch display panel displays normally; and the first control signal GAS1 is in high level when the embedded touch display panel enters a stage in which signal interruption occurs and touch scanning is performed. When the GOA circuit scans forward, the forward scanning DC control signal U2D is in high level and the reverse scanning DC control signal D2U is in low level; and when the GOA circuit scans reversely, the forward scanning DC control signal U2D is in low level and the reverse scanning DC control signal D2U is in high level.

Referring to FIG. 2 and FIG. 3, when the GOA circuit operates, firstly, the scanning signal G(n−2) of the (n−2)th-level GOA unit is in high level, the third thin-film transistor T3 is turned on, the forward scanning DC control signal U2D which is in high level outputs a first node control signal at the first node Q(n) via the third thin-film transistor T3, and the high level of the first node control signal is stored in the first capacitor C1; and at the same moment, the fifth thin-film transistor T5 is turned on, the constant-pressure low level VGL outputs a second node control signal at the second node P(n) via the fifth thin-film transistor T5, and the low level of the second node control signal is stored in the second capacitor C2.

Then, the embedded touch display panel enters a stage in which signal interruption occurs and touch scanning is performed, the first node control signal is retained in high level and the second node control signal is retained in low level, and the first clock signal CK1 outputs a low level; and at the same moment, the tenth thin-film transistor T10 is turned on, the low level of the first clock signal CK1 is output to the output end of the output module 103 via the tenth thin-film transistor T10, and the scanning signal G(n) is in low level.

It is to be noted that, as shown in FIG. 2, when the embedded touch display panel enters a stage in which signal interruption occurs and touch scanning is performed, the first node control signal on the first node Q(n) of the nth-level GOA unit is to be retained in high level. However, at the same moment, since the reverse scanning DC control signal D2U is in low level, the stored high level of the first node control signal will be leaked to the reverse scanning DC control signal D2U and the constant-pressure low level VGL. In addition, due to the electrical instability of thin-film transistors, if high current leakage occurs in the thin-film transistors, high charge leakage will occur in the first node control signal. After the embedded touch display panel enters a stage in which signal interruption occurs and touch scanning is performed, the level of the first node control signal is low. As a result, the tenth thin-film transistor T10 cannot be turned on completely. This will result in large delay of the scanning signal G(n) output by the nth-level GOA unit or result in a waveform amplitude lower than the constant-voltage high level. Further, if the scanning signal G(n) output by the nth-level GOA unit is abnormal, the first node control signal on the first node Q(n+2) of the (n+2)th-level GOA unit cannot be smoothly pulled up to the constant-voltage high level VGH. As a result, the scanning signal G(n+2) output by the (n+2)th-level GOA unit will become abnormal.

Further, in the (n+2)th-level GOA unit, after signal interruption occurs, the first node Q(n+2) is in constant-voltage low level VGL and the second node P(n+2) is in constant-voltage high level VGH. The second node P(n+2) is to be pulled down via the fifth thin-film transistor T5 while the first node Q(n+2) is pulled up by the high pulse of the scanning signal G(n) of the nth-level GOA unit, and the second node P(n+2) also pulls the first node Q(n+2) down via the ninth thin-film transistor T9. That is, the fifth thin-film transistor T5 and the ninth thin-film transistor T9 compete with each other so that it is difficult to pull the first node Q(n+2) up to the constant-voltage high level VGH. If, after signal interruption occurs, the scanning signal G(n) of the nth-level GOA unit becomes abnormal, the first node Q(n+2) of the (n+2)th-level GOA unit cannot be smoothly pulled up to the constant-voltage high level VGH. As a result, the output of the (n+2)th-level GOA unit becomes abnormal. Consequently, the circuit fails and the panel displays abnormally.

In the embodiment of the present disclosure, by providing a suppression module 105, when the embedded touch display panel enters a stage in which signal interruption occurs and touch scanning is performed, the second node control signal on the second node Q(n) is pulled down to the constant-voltage low level, so that the competition between the fifth thin-film transistor T5 and the ninth thin-film transistor T9 after signal interruption is eliminated. The first node Q(n+2) of the (n+2)th-level unit can be smoothly pulled up to the constant-voltage high level VGH even if the output of the nth-level scanning signal G(n) becomes slightly abnormal. This decreases the risk of stage-shift failure of the GOA circuit so that the stability of the circuit is improved.

Specifically, as shown in FIG. 3, when the embedded touch display panel enters a stage in which signal interruption occurs and touch scanning is performed, the first control signal GAS1 outputs a high level, the second thin-film transistor T2 is turned on, the constant-voltage low level VGL pulls the second node control signal on the second node down to the constant-voltage low level via the second thin-film transistor T2, so that the competition between the fifth thin-film transistor T5 and the ninth thin-film transistor T9 after signal interruption is eliminated. The first node Q(n+2) of the (n+2)th-level unit can be smoothly pulled up to the constant-voltage high level VGH even if the output of the nth-level scanning signal G(n) becomes slightly abnormal. This decreases the risk of stage-shift failure of the GOA circuit so that the stability of the circuit is improved.

Then, after the embedded touch display panel completes one touch scanning, the first clock signal CK1 is in high level, and the first node control signal on the first node Q(n) is bootstrapped to a higher level; and at the same moment, the second node control signal on the second node P(n) is retained in the constant-voltage low level, and the scanning signal G(n) of the nth-level GOA unit is in high level.

Finally, the third clock signal CK3 is in high level, the first node control signal on the first node Q(n) is pulled down to the constant-voltage low level VGL, and the second node control signal on the second node P(n) is pulled up to the constant-voltage high level VGH, and the scanning signal G(n) of the nth-level GOA unit is in low level.

Figure 4:
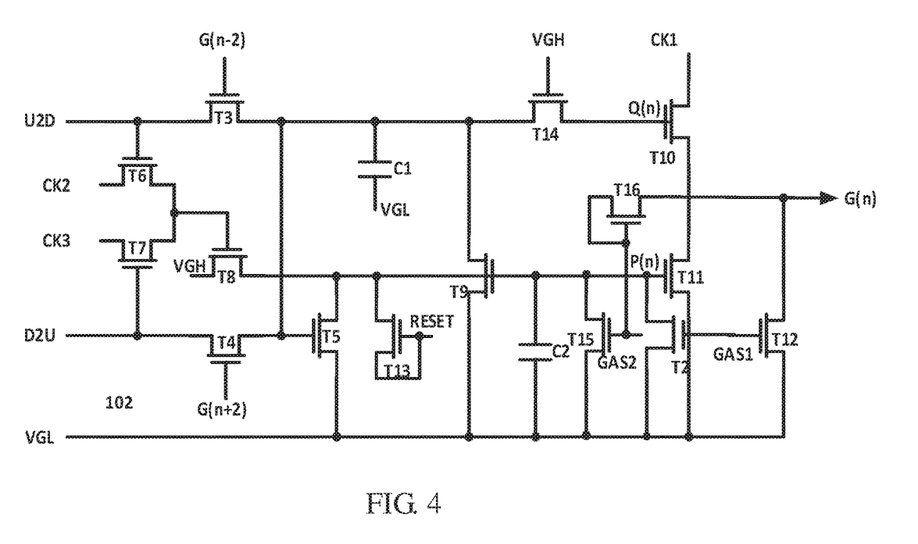
FIG. 4 is another circuit diagram of the GOA circuit according to a preferred embodiment of the present disclosure.

Please refer to FIG. 4, which is another circuit diagram of the GOA circuit according to a preferred embodiment of the present disclosure. As shown in FIG. 4, the difference between this GOA circuit and the GOA circuit shown in FIG. 1 is that this GOA circuit further comprises a fourteenth thin-film transistor T14, a fifteenth thin-film transistor T15, and a sixteenth thin-film transistor T16.

A source of the fourteenth thin-film transistor T14 is connected to the drain of the third thin-film transistor T3, the constant-voltage high level VGH is applied to a gate of the fourteenth thin-film transistor T14, and a drain of the fourteenth thin-film transistor T14 is connected to the first node Q(n).

The constant-voltage low level VGL is applied to a source of the fifteenth thin-film transistor T15, the second control signal GAS2 is applied to a gate of the fifteenth thin-film transistor T15, and a drain of the fifteenth thin-film transistor T15 is connected to the second node P(n).

The second control signal GAS2 is applied to a source and a gate of the sixteenth thin-film transistor T16, and a drain of the sixteenth thin-film transistor T16 is connected to the drain of the tenth thin-film transistor T10.

It is to be noted that, when the GOA circuit of the present disclosure operates, the constant-voltage high level is applied to the gate of the fourteenth thin-film transistor so that the clock of the fourteenth thin-film transistor is in the ON state.

When the GOA circuit of the present disclosure operates, the second control signal is applied to the gates of the fifteenth thin-film transistor and the sixteenth thin-film transistor and the second control signal is in the constant-voltage low level, so that the fifteenth thin-film transistor and the sixteenth thin-film transistor are in the OFF state.

In addition, in the GOA circuit of the present disclosure, according to specific requirements, it is also possible to adjust the level of signals applied to the gates of the fourteenth thin-film transistor T14, the fifteenth thin-film transistor T15 and the sixteenth thin-film transistor T16 and to control the state of the fourteenth thin-film transistor T14, the fifteenth thin-film transistor T15 and the sixteenth thin-film transistor T16. Thus, the application of this GOA circuit is more flexible.

In a GOA circuit according to the embodiment of the present disclosure, by providing a pre-charge module in the nth-level GOA unit, when the embedded touch display panel enters a stage in which signal interruption occurs and touch scanning is performed, the second node control signal on the second node is pulled down to the constant-voltage low level. This relieves the insufficiency in retaining capability of the GOA circuit in the case of TP interruption and further decreases the risk of stage-shift failure so that this GOA circuit becomes more stable.

The present disclosure further provides an embedded touch display panel that includes the foregoing GOA circuit, and therefore it can be specifically referred to the foregoing preferred embodiment and will not described in detail again to avoid redundancy.

In a GOA circuit and an embedded touch display panel according to the embodiment of the present disclosure, by providing a pre-charge module in the nth-level GOA unit, when the embedded touch display panel enters a stage in which signal interruption occurs and touch scanning is performed, the second node control signal on the second node is pulled down to the constant-voltage low level. This relieves the insufficiency in retaining capability of the GOA circuit in the case of TP interruption and further decreases the risk of stage-shift failure so that this GOA circuit becomes more stable.

The liquid crystal display assembly according to the embodiments of the present disclosure has been described in detail above. The principles and implementations of the present disclosure have been explained by specific cases. The description of the embodiments is merely used for helping understand the present disclosure. Meanwhile, it will be understood by those skilled in the art that various modifications may be made to the specific implementations and application ranges without departing from the spirit of the present disclosure. The content of the description will not be interpreted as any limitations to the present disclosure.

What is claimed is:

1. A GOA (Gate driver On Array) circuit configured to be applied in an embedded touch display panel, comprising multiple levels of GOA units which are cascaded with each other, the nth-level GOA unit comprising a forward/reverse scanning control module, a node control module, an output module, an output control module, and a suppression module; wherein
   the forward/reverse scanning control module is configured to output a first node control signal at a first node and output a second node control signal at a second node according to a forward scanning DC control signal and a reverse scanning DC control signal;
   the node control module is coupled to the first node and the second node and configured to pull the first node control signal down to a constant-voltage low level and pull the second node control signal up to a constant-voltage high level;
   the output module is coupled to the first node and electrically connected to a first clock signal and configured to output a scanning signal according to the first node control signal and the first clock signal;
   the output control module is electrically connected to the first control signal and configured to pull the scanning signal down to the constant-voltage low level according to the first control signal; and
   the suppression module is coupled to the second node and configured to pull the second node control signal on the second node down to the constant-voltage low level when the embedded touch display panel enters a stage in which signal interruption occurs and touch scanning is performed;
   wherein the suppression module comprises a second thin-film transistor;
   the constant-voltage low level is applied to a source of the second thin-film transistor, the first control signal is applied to a gate of the second thin-film transistor, and a drain of the second thin-film transistor is connected to the second node;
   wherein the first control signal is in low level when the embedded touch display panel displays normally; and the first control signal is in high level when the embedded touch display panel enters a stage in which signal interruption occurs and touch scanning is performed.

2. The GOA circuit as claimed in claim 1, wherein the forward/reverse scanning control module comprises a third thin-film transistor, a fourth thin-film transistor, a fifth thin-film transistor, a first capacitor and a second capacitor;
   the forward scanning DC control signal is applied to a source of the third thin-film transistor, a scanning signal of a (n−2)th-level GOA unit is applied to a gate of the third thin-film transistor, and a drain of the third thin-film transistor is connected to the first node, the drain of the second thin-film transistor, and the gate of the third thin-film transistor;
   the reverse scanning DC control signal is applied to a source of the fourth thin-film transistor, and a scanning signal of a (n+2)th-level GOA unit is applied to a gate of the fourth thin-film transistor;
   the constant-voltage low level is applied to a source of the fifth thin-film transistor, and a drain of the fifth thin-film transistor is connected to the second node;
   one end of the first capacitor is connected to the first node, and the constant-voltage low level is applied to the other end of the first capacitor; and
   one end of the second capacitor is connected to the second node, and the constant-voltage low level is applied to the other end of the second capacitor.

3. The GOA circuit as claimed in claim 1, wherein the node control module comprises a sixth thin-film transistor, a seventh thin-film transistor, an eighth thin-film transistor and a ninth thin-film transistor;
   a second clock signal is applied to a source of the sixth thin-film transistor, the forward scanning DC control signal is applied to a gate of the sixth thin-film transistor, and a drain of the sixth thin-film transistor is connected to a gate of the eighth thin-film transistor;
   a third clock signal is applied to a source of the seventh thin-film transistor, the reverse scanning DC control signal is applied to a gate of the seventh thin-film transistor, and a drain of the seventh thin-film transistor is connected to the gate of the eighth thin-film transistor;
   the constant-voltage high level is applied to a source of the eighth thin-film transistor, and a drain of the eighth thin-film transistor is connected to the second node; and
   the constant-voltage low level is applied to a source of the ninth thin-film transistor, a gate of the ninth thin-film transistor is connected to the second node, and a drain of the ninth thin-film transistor is connected to the first node.

4. The GOA circuit as claimed in claim 1, wherein the output module comprises a tenth thin-film transistor; and
   the first clock signal is applied to a source of the tenth thin-film transistor, a gate of the tenth thin-film transistor is connected to the first node, and a drain of the tenth thin-film transistor is connected to an output end of the output module.

5. The GOA circuit as claimed in claim 1, wherein the output module comprises an eleventh thin-film transistor and a twelfth thin-film transistor;

the constant-voltage low level is applied to a source of the eleventh thin-film transistor, a gate of the eleventh thin-film transistor is connected to the second node, and a drain of the eleventh thin-film transistor is connected to an output end of the output module; and the constant-voltage low level is applied to a source of the twelfth thin-film transistor, a gate of the twelfth thin-film transistor is connected to the first control signal, and a drain of the twelfth thin-film transistor is connected to the output end of the output module.

6. The GOA circuit as claimed in claim 1, wherein the nth-level GOA unit further comprises a reset module; and the reset module comprises a thirteenth thin-film transistor, wherein a reset signal is applied to a source and to a drain of the thirteenth thin-film transistor, and a drain of the thirteenth thin-film transistor is electrically connected to the second node.

7. The GOA circuit as claimed in claim 1, wherein, when the GOA circuit scans forward, the forward scanning DC control signal is in high level and the reverse scanning DC control signal is in low level; and when the GOA circuit scans reversely, the forward scanning DC control signal is in low level and the reverse scanning DC control signal is in high level.

8. A GOA (Gate driver On Array) circuit configured to be applied in an embedded touch display panel, comprising multiple levels of GOA units which are cascaded with each other, the nth-level GOA unit comprising a forward/reverse scanning control module, a node control module, an output module, an output control module, and a suppression module; wherein the forward/reverse scanning control module is configured to output a first node control signal at a first node and output a second node control signal at a second node according to a forward scanning DC control signal and a reverse scanning DC control signal;

the node control module is coupled to the first node and the second node and configured to pull the first node control signal down to a constant-voltage low level and pull the second node control signal up to a constant-voltage high level;

the output module is coupled to the first node and electrically connected to a first clock signal and configured to output a scanning signal according to the first node control signal and the first clock signal;

the output control module is electrically connected to the first control signal and configured to pull the scanning signal down to the constant-voltage low level according to the first control signal; and the suppression module is coupled to the second node and configured to pull the second node control signal on the second node down to the constant-voltage low level when the embedded touch display panel enters a stage in which signal interruption occurs and touch scanning is performed.

9. The GOA circuit as claimed in claim 8, wherein the suppression module comprises a second thin-film transistor; and the constant-voltage low level is applied to a source of the second thin-film transistor, the first control signal is applied to a gate of the second thin-film transistor, and a drain of the second thin-film transistor is connected to the second node.

10. The GOA circuit as claimed in claim 8, wherein the forward/reverse scanning control module comprises a third thin-film transistor, a fourth thin-film transistor, a fifth thin-film transistor, a first capacitor and a second capacitor;

the forward scanning DC control signal is applied to a source of the third thin-film transistor, a scanning signal of a (n−2)th-level GOA unit is applied to a gate of the third thin-film transistor, and a drain of the third thin-film transistor is connected to the first node, the drain of the second thin-film transistor, and the gate of the third thin-film transistor;

the reverse scanning DC control signal is applied to a source of the fourth thin-film transistor, and a scanning signal of a (n+2)th-level GOA unit is applied to a gate of the fourth thin-film transistor;

the constant-voltage low level is applied to a source of the fifth thin-film transistor, and a drain of the fifth thin-film transistor is connected to the second node;

one end of the first capacitor is connected to the first node, and the constant-voltage low level is applied to the other end of the first capacitor; and one end of the second capacitor is connected to the second node, and the constant-voltage low level is applied to the other end of the second capacitor.

11. The GOA circuit as claimed in claim 8, wherein the node control module comprises a sixth thin-film transistor, a seventh thin-film transistor, an eighth thin-film transistor and a ninth thin-film transistor;

a second clock signal is applied to a source of the sixth thin-film transistor, the forward scanning DC control signal is applied to a gate of the sixth thin-film transistor, and a drain of the sixth thin-film transistor is connected to a gate of the eighth thin-film transistor;

a third clock signal is applied to a source of the seventh thin-film transistor, the reverse scanning DC control signal is applied to a gate of the seventh thin-film transistor, and a drain of the seventh thin-film transistor is connected to the gate of the eighth thin-film transistor;

the constant-voltage high level is applied to a source of the eighth thin-film transistor, and a drain of the eighth thin-film transistor is connected to the second node; and the constant-voltage low level is applied to a source of the ninth thin-film transistor, a gate of the ninth thin-film transistor is connected to the second node, and a drain of the ninth thin-film transistor is connected to the first node.

12. The GOA circuit as claimed in claim 8, wherein the output module comprises a tenth thin-film transistor; and the first clock signal is applied to a source of the tenth thin-film transistor, a gate of the tenth thin-film transistor is connected to the first node, and a drain of the tenth thin-film transistor is connected to an output end of the output module.

13. The GOA circuit as claimed in claim 8, wherein the output module comprises an eleventh thin-film transistor and a twelfth thin-film transistor;

the constant-voltage low level is applied to a source of the eleventh thin-film transistor, a gate of the eleventh thin-film transistor is connected to the second node, and a drain of the eleventh thin-film transistor is connected to an output end of the output module; and the constant-voltage low level is applied to a source of the twelfth thin-film transistor, a gate of the twelfth thin-film transistor is connected to the first control signal, and a drain of the twelfth thin-film transistor is connected to the output end of the output module.

14. The GOA circuit as claimed in claim 8, wherein the nth-level GOA unit further comprises a reset module; and the reset module comprises a thirteenth thin-film transistor, wherein a reset signal is applied to a source and to a drain of the thirteenth thin-film transistor, and a drain of the thirteenth thin-film transistor is electrically connected to the second node.

15. The GOA circuit as claimed in claim 8, wherein the first control signal is in low level when the embedded touch display panel displays normally; and the first control signal is in high level when the embedded touch display panel enters a stage in which signal interruption occurs and touch scanning is performed.

16. The GOA circuit as claimed in claim 8, wherein, when the GOA circuit scans forward, the forward scanning DC control signal is in high level and the reverse scanning DC control signal is in low level; and when the GOA circuit scans reversely, the forward scanning DC control signal is in low level and the reverse scanning DC control signal is in high level.

17. An embedded touch display panel, comprising a GOA circuit, wherein the GOA circuit is configured to be applied in an embedded touch display panel and comprises multiple levels of GOA units which are cascaded with each other, the nth-level GOA unit comprising a forward/reverse scanning control module, a node control module, an output module, an output control module, and a suppression module; wherein
the forward/reverse scanning control module is configured to output a first node control signal at a first node and output a second node control signal at a second node according to a forward scanning DC control signal and a reverse scanning DC control signal;
the node control module is coupled to the first node and the second node and configured to pull the first node control signal down to a constant-voltage low level and pull the second node control signal up to a constant-voltage high level;
the output module is coupled to the first node and electrically connected to a first clock signal and configured to output a scanning signal according to the first node control signal and the first clock signal;
the output control module is electrically connected to the first control signal and configured to pull the scanning signal down to the constant-voltage low level according to the first control signal; and
the suppression module is coupled to the second node and configured to pull the second node control signal on the second node down to the constant-voltage low level when the embedded touch display panel enters a stage in which signal interruption occurs and touch scanning is performed.

18. The embedded touch display panel as claimed in claim 17, wherein the suppression module comprises a second thin-film transistor; and
the constant-voltage low level is applied to a source of the second thin-film transistor, the first control signal is applied to a gate of the second thin-film transistor, and a drain of the second thin-film transistor is connected to the second node.

19. The embedded touch display panel as claimed in claim 17, wherein the first control signal is in low level when the embedded touch display panel displays normally; and the first control signal is in high level when the embedded touch display panel enters a stage in which signal interruption occurs and touch scanning is performed.

20. The embedded touch display panel as claimed in claim 17, wherein, when the GOA circuit scans forward, the forward scanning DC control signal is in high level and the reverse scanning DC control signal is in low level; and when the GOA circuit scans reversely, the forward scanning DC control signal is in low level and the reverse scanning DC control signal is in high level.

\* \* \* \* \*

UNITED STATES PATENT AND TRADEMARK OFFICE
CERTIFICATE OF CORRECTION

PATENT NO. : 10,269,320 B1
APPLICATION NO. : 15/742471
DATED : April 23, 2019
INVENTOR(S) : Qiang Gong

Page 1 of 1

It is certified that error appears in the above-identified patent and that said Letters Patent is hereby corrected as shown below:

On the Title Page

At "(73) Assignee", delete "WUHAN CHINA STAR OPTOELECTRONICS SEMICONDUCTOR DISPLAY TECHNOLOGYCO., LTD." and insert --WUHAN CHINA STAR OPTOELECTRONICS TECHNOLOGY CO., LTD.--

Signed and Sealed this
Thirteenth Day of August, 2019

Andrei Iancu
*Director of the United States Patent and Trademark Office*